United States Patent [19]
Sato et al.

[11] Patent Number: 5,521,390
[45] Date of Patent: May 28, 1996

[54] NANODISPLACEMENT PRODUCING APPARATUS

[75] Inventors: Toshihiko Sato, Kokubunji; Masakazu Ichikawa, Tokyo; Toshikazu Shimada, Kokubunji, all of Japan

[73] Assignee: Hitachi, Ltd., Tokyo, Japan

[21] Appl. No.: 341,949

[22] Filed: Nov. 16, 1994

[30] Foreign Application Priority Data

Nov. 16, 1993 [JP] Japan ................................ 5-286405

[51] Int. Cl.[6] ...................................... H01J 37/20
[52] U.S. Cl. ................. 250/442.11; 250/306; 250/492.2; 310/317
[58] Field of Search .............................. 359/330; 250/306, 250/492.2, 442.11; 310/317

[56] References Cited

U.S. PATENT DOCUMENTS

| | | | |
|---|---|---|---|
| 3,555,453 | 1/1971 | Littauer | 310/317 |
| 5,017,806 | 5/1991 | Edelstein | 359/330 |
| 5,206,868 | 4/1993 | Deacon | 359/330 |
| 5,297,156 | 3/1994 | Deacon | 359/330 |
| 5,353,115 | 10/1994 | McIntyre | 250/442.11 |
| 5,365,366 | 11/1994 | Kafka et al. | 359/330 |
| 5,377,043 | 12/1994 | Pelouch et al. | 359/330 |

OTHER PUBLICATIONS

C. Julian Chen, "Introduction to Scanning Tunneling Microscopy", Oxford University Press, (1993).
A. Heidmann et al. The American Physical Society, vol. 59, No. 22 pp. 2555–2557 (1987).
T. Debuisschert et al., "Quantum Optics", vol. 1, pp. 3–9, (1989).

*Primary Examiner*—Jack I. Berman
*Attorney, Agent, or Firm*—Antonelli, Terry, Stout & Kraus

[57] ABSTRACT

An optical nanodisplacement producing apparatus is realized by employing an optical parametric oscillator of which cavity length is varied in correspondence with a wavelength or the intensity of the output light signal to achieve a fine-displacement producing mechanism. An optical nanodisplacement producing apparatus having high resolution less than 0.1 nm and a highly stable characteristic is realized as a very fine pattern forming/monitoring apparatus.

22 Claims, 12 Drawing Sheets

NANODISPLACEMENT PRODUCING APPARATUS

BACKGROUND OF THE INVENTION

The present invention generally relates to a nanodisplacement producing apparatus. More specifically, the present invention concerns a nanodisplacement producing apparatus suitable for any of fine pattern producing apparatuses and measuring apparatuses, equipped with fine moving mechanisms of STM (Scanning Tunneling Microscopy), electron beam lithography apparatus, and scanning electron microscope and so on.

In the conventional fine pattern producing/monitoring apparatus, the fine patterns are produced/monitored by employing the fine moving mechanism constructed of the piezoelectric elements. This conventional technique is described in "Introduction to Scanning Tunneling Microscopy" written by C. Julian Chen, Oxford University Press, 1993, FIG. 1.1. In accordance with this prior art, the three-axial piezo-electric transducers so-called as a "tripot" are used to drive the probe of STM (scanning tunneling microscope). Since such a measuring mechanism for measuring the expansion dimensions of the piezoelectric transducers in resolution lower than 1 nanometer is not assembled in this STM apparatus, no positioning control of the probe within the plane parallel to the sample in the precision smaller than 1 nanometer is carried out, In other words, drifts and the like caused by thermal expansion of the piezoelectric transducers are not controlled. Furthermore, there is no means for realizing by a single hardware, a so-called "zooming mechanism" for monitoring/controlling the distance over several tens of micrometers at high precision.

Also, with respect to the sensitivity for the variations in the resonator lengths occurred in operations of the optical parametric oscillator, the publication (written by T. Debuisschert et al., "QUANTUM OPTICS" volume 1, pages 3 to 9, 1989) describes that when the length of a resonator is changed from 2 nm to 3 nm, the oscillation of the resonator would be stopped. However, this publication considers the control of the resonator length only in view of stabilization of the output strengths of this optical parametric oscillator, but does not pay any attention to such a view point, i.e., effectiveness of the optical parametric oscillator functioning as a nanodisplacement element by utilizing the variation in the resonator lengths.

SUMMARY OF THE INVENTION

A first object of the present invention is to provide such a means capable of achieving a highly stable characteristic with high resolution less than 0.1 nanometer as a very fine pattern forming/monitoring apparatus.

A second object of the present invention is to provide such a means capable of transporting either a pattern forming apparatus with a probe, or a monitoring apparatus with a probe over a wide range of several tens of micrometers, while achieving high position resolution.

To achieve the above-described first and second objects, according to the present invention, such a means for constituting an element that realizes a very small displacement by a variation in resonator lengths of an optical parametric oscillator, is employed, so that a very small change in the resonator lengths is detected based on a variation in outputs derived from the parametric oscillator.

In general, a conversion efficiency of non-linear optical crystal is not always greater than that of other laser media, and to operate an optical parametric oscillator, an optical resonator used in this parametric oscillator must employ a sufficiently large "Finesse" (concretely speaking, resonator mirror with high reflectivity is employed). As a result, a resonant frequency band is limited to a very narrow range.

The oscillation frequencies of the signal light and the idler light, produced by the wavelength converting effect of the non-linear optical crystal, are on the other hand determined by the phase matching condition between the pumping light wavelength and the non-linear optical crystal. When the optical resonator has such a resonator length as being resonated with the signal/idler light, oscillations of the optical parametric oscillator can be established. To the contrary, when the oscillation frequencies of the signal light and the idler light own different values from each other, such a resonance condition that two sets of light having such different oscillation frequencies are resonated within a single resonator at the same time, becomes very severe.

The above-described resonance condition under which two sets of light having the different oscillation frequencies are simultaneously resonated, will now be explained with reference to FIG. 2.

By the wavelength converting effect of the non-linear optical crystal, pumping light having an oscillation frequency of "f0" is converted into signal light (oscillation frequency of "f0+df") and idler light (oscillation frequency of "f0−df") whose oscillation frequency is slightly different from that of the signal light. It should be understood that "df" is sufficiently smaller than "f0" (f0>>df). Here, it is now assumed that among fringes with respect to an oscillation frequency (f0+fd) of the optical resonator, (m+1)th fringe is coincident with the oscillation frequency of the signal (oscillation frequency of F0+df), and is resonated with this signal. Since the free spectral range with respect to the oscillation frequency (f0−fd) of the optical resonator is different from that with regard to the oscillation frequency (f0+df), the two fringes for the respective oscillation frequencies are not simultaneously resonated with either the signal light, or the idler light. It is assumed in FIG. 2 that the n-th fringe with respect to the oscillation frequency (f0−df) is accidently resonated with the idler light (oscillation frequency of "f0−df"). Such a condition corresponds to an oscillation establishing condition.

On one hand, real pumping light owns a width of an oscillation line (namely, profile of oscillation line) having a finite value. As a consequence, both the signal light and the idler light own profiles reflecting the pump light profile. On the other hand, a fringe of a resonator with respect to each of oscillation frequencies owns a finite width. Therefore the condition under which the above-described oscillation can be established has some margins reflecting these widths. As a consequence, even when the pumping light power is constant, intensity of an oscillation output is varied in accordance with overlapping conditions among the profile of signal light or idler light, and the profiles of the respective fringes. In other words, the threshold value of the pumping light power required for oscillation is directly proportional to a product of both shifts (A) and (B). That is, one shift (A) is defined by a mutual shift between the peak frequency of the signal light and the peak frequency of the (m+1)th fringe of the resonator resonated with this signal light, and further the other shift (B) is defined by a mutual shift between the peak frequency of the idler light and the peak frequency of the n-th fringe of the resonator resonated to this idler light. The resonance condition for the parametric oscillator described above is very much different from that for an ordinary Fabry-Perot resonator. The resonance condition for the ordinary Fabry-Perot resonator is established by the coincidence of two frequencies; namely, the oscillation frequency of an incoming light and the transmission frequency of the Fabry-Perot resonator cavity. On the other hand, the resonance condition for the parametric oscillator involves three different frequencies; namely, the frequencies of the pump, signal, and idler. Because of this difference in the number of frequencies involved, the resonance condition for the parametric oscillator is far stricter than that of the Fabry-Perot resonator.

It implies that the resonance condition is no longer established due to a slight change in the cavity, or resonator length. Such a severe resonance condition is more emphasized since the width of the fringe of the resonator becomes narrower in a case of such an optical parametric resonator that the resonator having a high "Finesse" must be employed.

Oscillation frequencies of signal light and idler light are determined based upon a pumping light wavelength and a phase matching condition of non-linear optical crystal. When the pumping light oscillation frequency is varied, the oscillation frequencies of the signal light and the idler light are accordingly changed. As a consequence, the resonator length is changed by the effects of the control mechanism for maintaining the resonance condition, and then a new resonator length would be set in order to be resonated with the oscillation frequencies of the changed signal light and also the changed idler light. This phenomenon implies that a desirable resonator length cannot be stably maintained only by controlling the parametric oscillatior output signal to become constant. The variation in the oscillation frequencies of the pumping light may be recognized as a sort of noise in view of controlling of the variation in the resonance lengths. As a consequence, it should employ such a means capable of suppressing the variation in the output oscillation frequencies of the pumping light laser.

However, the above-described phenomenon also implies that the resonator length of the optical resonator can be changed by varying the wavelength of the pumping light if the resonance-condition maintaining feedback mechanism is available. As a result, the resonator length is set by selecting the oscillation frequency of the pumping light, and the resonator length set based on the selected oscillation frequency can be maintained under stable condition by the feedback mechanism.

At a time instant when the resonance condition is satisfied, the light is trapped within the resonator, and then the optical parametric oscillator is transferred into the oscillation condition. A rapid increase in the output intensities in conjunction with such a transition stage may be caused by that the non-linear optical crystal within the optical parametric oscillator is an active medium, which never happens to occur in the normal Fabry-Perot cavity. Since such a transition stage occurs, a strong variation in the oscillation outputs would be produced in the optical parametric oscillator even when a slight change happens to occur in the resonator lengths. Because of this variation in the output strengths of the optical parametric oscillator, the signal detection of the variation in the resonator lengths can be performed in the high sensitivity, whereby the objects of the present invention could be achieved.

The optical parametric oscillator varied in response to the wavelengths of the light, according to the present invention, is employed, thereby realizing a nanodisplacement producing apparatus. As a consequence, it is possible to realize such a fine-displacement producing mechanism capable of realizing very small displacement with an error smaller than 0.1 nm, which could not be achieved by the conventional fine-displacement producing mechanism. The standard dimension with an error less than 0.1 nm can be obtained by these fine-displacement producing mechanisms, and also a length of several micrometers can be measured to an accuracy of 0.1 nm. Furthermore, since the fine-displacement producing mechanism according to the present invention is used in the scanning probe microscope and the like, stabilities during the image acquisition can be improved. As a consequence, not only unidirectional scanning operation is available, but also bidirectional scanning operation is available. The mechanical responce characteristics of the piezoelectric elements could be improved by employing the non-contact type length measuring structure. With these improvements, resolution can be increased more than ten times higher than that of the conventional nanodisplacement producing apparatus, the image acquisition speed can be increased more than ten times, and the area on the sample which has been obtained during the single image acquisition operation can be improved more than 100 times. As previously described, in accordance with the present invention, the conventional problems could be solved, and furthermore such a nanodisplacement producing apparatus having a completely novel function can be realized.

DESCRIPTION OF THE PREFERRED EMBODIMENTS

EMBODIMENT 1

The present invention will now be described in detail by using embodiments.

A nanodisplacement producing apparatus according to a first embodiment of the present invention will be explained with reference to FIG. 1.

Figure 1:
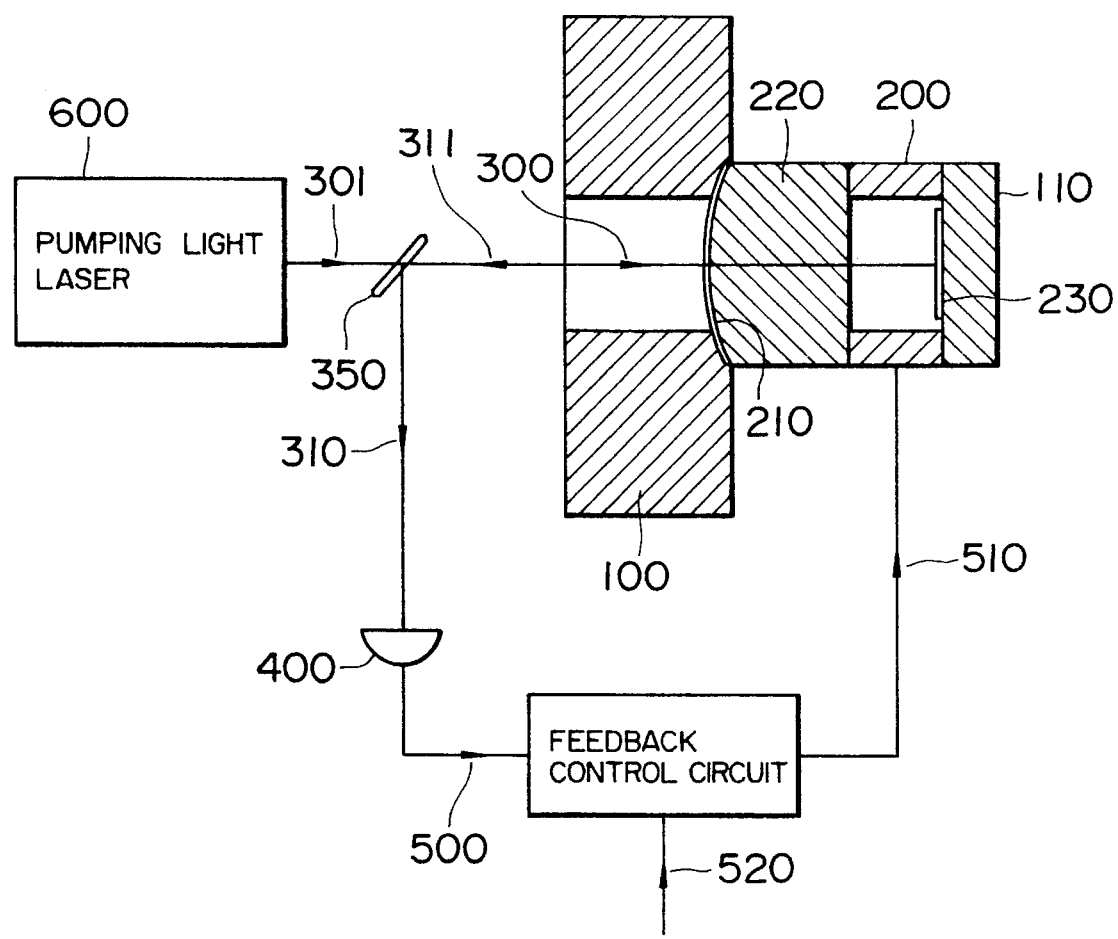
FIG. 1 schematically shows a nanodisplacement producing apparatus according to a first embodiment of the present invention.
Figure 2:
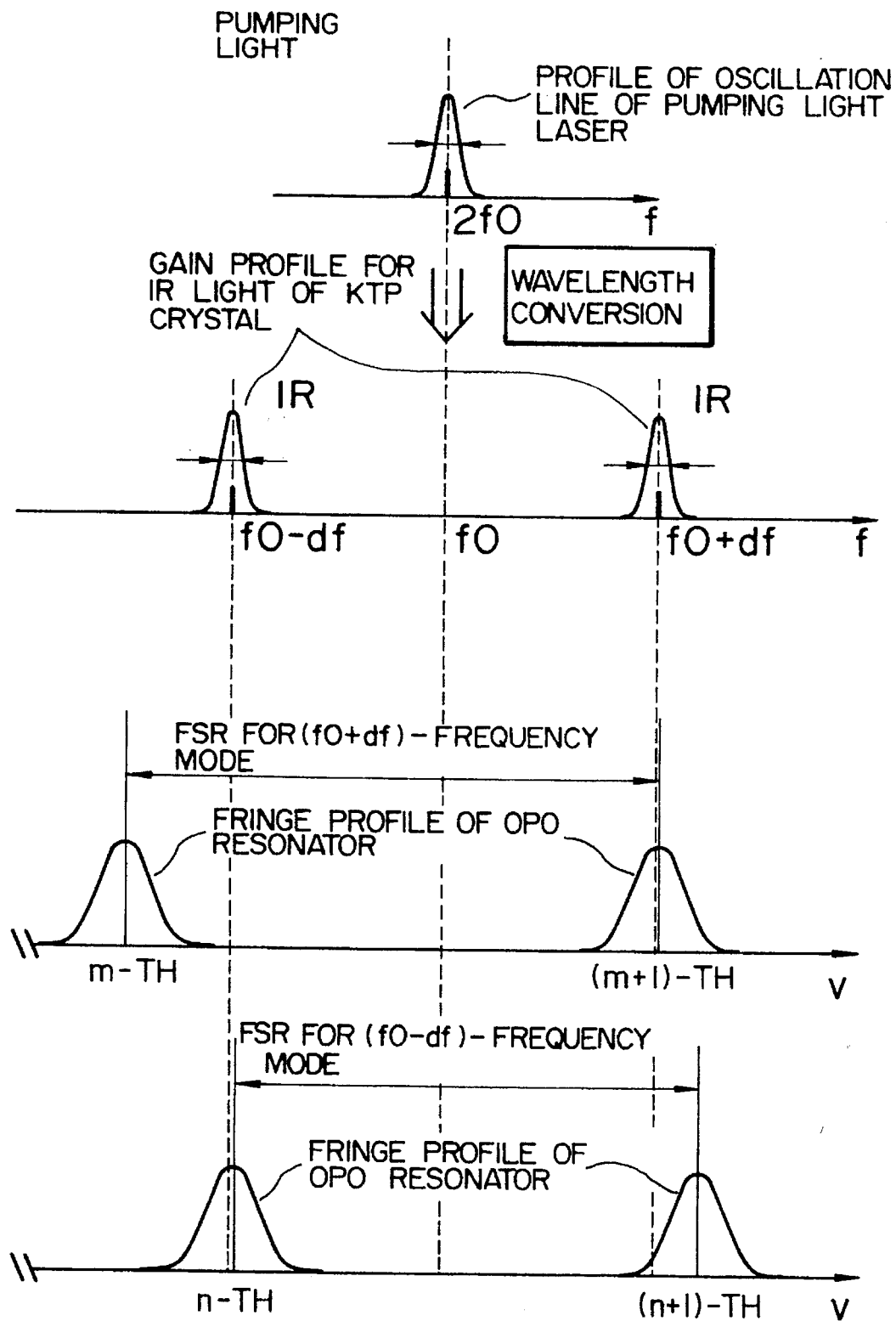
FIG. 2 explanatorily indicates resonant conditions of the present invention.

In FIG. 1, reference numeral 100 indicates a block to which a parametric oscillator is fixed. The parametric oscillator is arranged by such elements that a nonlinear optical crystal 220 is fixed on the block 100, and subsequently a cylindrical piezoelectric element 200 is fixed, and furthermore a movable plate 110 is fixed on an opposite surface of the cylindrical piezoelectric element 200. The nonlinear optical crystal 220 has a spherical surface on one end and the dielectric spherical mirror 210 is coated on this surface. Also the flat mirror 230 is coated on the flat surface of the movable plate 110.

Reference numeral 600 indicates a pumping light laser whose oscillation wavelength is stabilized. An output 301 of this pumping light laser 600 passes through a beam sampler 350 to become pumping light 300 which will then be entered from the place on the side of the spherical mirror 210 into the optical parametric oscillator. Both a signal and idler light produced from the pumping light 300 by way of the wavelength conversion by the nonlinear optical crystal 220 are simultaneously resonated in an optical resonator constituted by the spherical mirror 210 and the flat mirror 230, whereby parametric oscillation can be established. As a consequence, a parametric oscillation output 311 is constructed of the signal and idler light. The parametric oscillation output 311 is separated from the light path of the pumping light 300 by the beam sampler 350, and an output 310 of the parametric oscillator consists of the signal and idler light. The parametric oscillator output 310 is detected by a light detector 400 as a light intensity signal 500. This light intensity signal 500 changes as the length of the resonator changes. When such a control operation is carried out in a way that a change in the light intensity signals 500 is detected, and this signal change is fed back to a piezo-actuator signal 510 so as to make the parametric oscillator output signal 500 constant, thereby the length of the resonator can be maintained at a constant length. Such a feedback mechanism is a feedback control circuit.

It should be noted that the length of the resonator implies an interval between the mirror 210 and the mirror 230, and the distance controlled in accordance with the present invention corresponds to a distance between the surface on which the mirror 230 is coated and the surface on which the mirror 210 is coated.

When the length of the resonator is desired to be varied, it may be controlled by changing the parametric oscillator output signal 500. The parametric oscillator output signal 500 is determined in response to an output setting signal 520. In other words, this output setting signal 520 is changed to obtain a desirable length of this resonator.

EMBODIMENT 2

Figure 3:
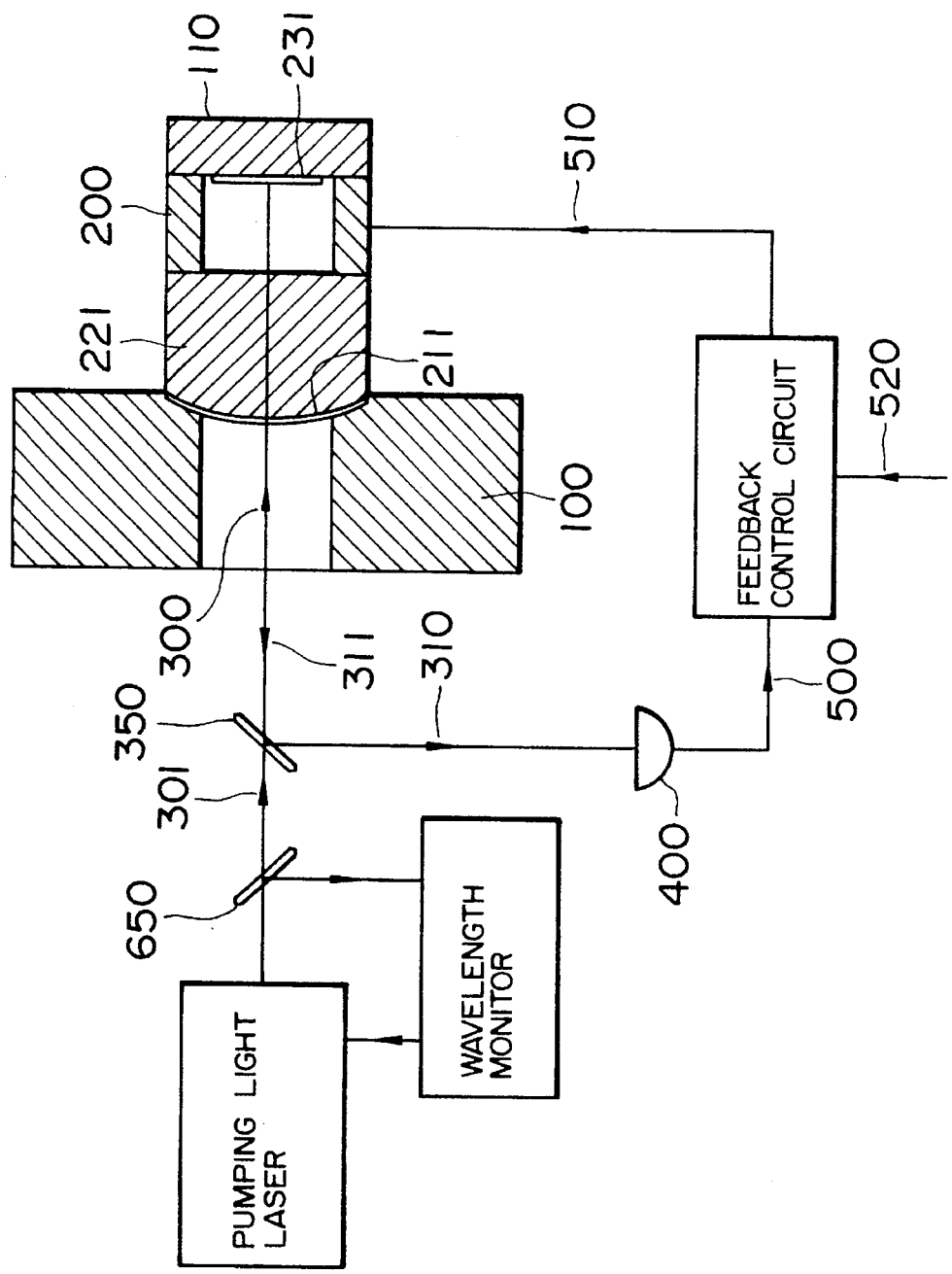
FIG. 3 schematically represents a nanodisplacement producing apparatus according to a second embodiment of the present invention.
Figure 4:
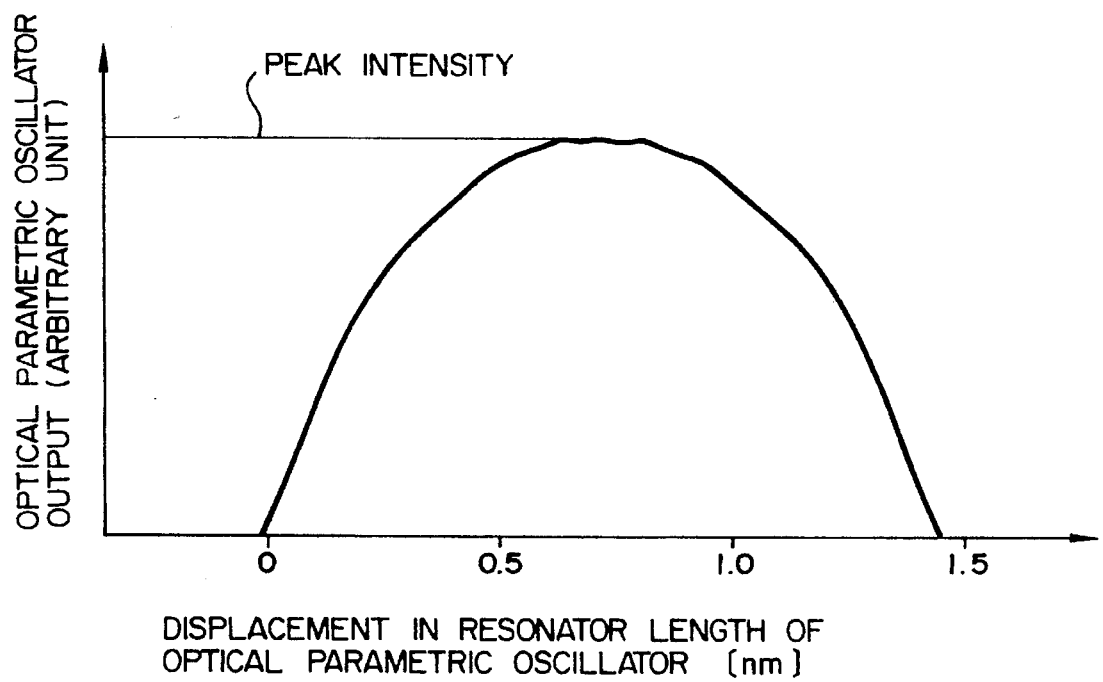
FIG. 4 is an explanatory diagram for explaining operations of the second embodiment of the present invention.

Referring to FIG. 3 and FIG. 4, a second embodiment of the present invention will be explained.

In FIG. 3, there is shown the second embodiment of the present invention. As the pumping light laser, a laser line of 514.5 nm of an argon ion laser is employed. A portion of an oscillator output is sampled by a beam splitter 650, and a change in the oscillating wavelengths is detected by a wavelength monitor arranged by an iodide cell, and further this detected signal is fed back to a resonator length control mechanism of the argon ion laser so as to stabilize the oscillation frequency of the laser line. With these mechanisms, the oscillation frequency of the pumping light may be controlled to become a width of an oscillation frequency below 200 KHz. An output 301 whose oscillating line width has been controlled is transmitted through the beam sampler 350, and then inputted into an optical parametric oscillator. In the present invention, KTP crystal 221 is employed as the nonlinear optical crystal. The optical parametric oscillator is arranged by the flat mirror 231 on the movable plate, the KTP crystal 221, and the spherical mirror 211 coated on the KTP crystal 221, and other constructive elements are identical to those of the first embodiment shown in FIG. 1. In accordance with the present invention, one surface of the spherical mirror 211 on the KTP crystal 221 is coated with a high reflection coat having a reflectivity of 99.0% with respect to the signal light and the idler light, and also with a coat having a reflectivity of 11% with respect to the pumping light. The opposite surface of this spherical mirror 211 on the KTP crystal 221 is coated with an anti-reflection coating having a reflectivity of 0.07% with respect to the signal light and the idler light, and of 0.08% with respect to the pumping light. The flat mirror 231 on the movable plate is coated with a high reflectivity coating having a reflectivity of 99.9% with respect to the signal light and the idler light, and an anti-reflection coating having a reflectivity of 5% with respect to the pumping light. A resonator is constructed which is resonated at the same time with respect to the signal light and the idler light between the spherical mirror 211 on the KTP crystal 221 and the flat mirror 231 on the movable plate. Further, the length of the KTP crystal is 7 mm and this KTP crystal is arranged at a position separated from the spherical mirror by 2 mm.

When power of the pumping light 300 is 500 mW, the resulting output 310 from the parametric oscillator becomes 80 mW in combination with the signal light and the idler light. Both of the signal/idler light is inputted as the light intensity signal 500 to the feedback control circuit. In the feedback control circuit, a resonator length setting signal 520 is compared with a light intensity control signal to obtain a difference signal, and then such a voltage is applied to the cylindrical piezoelectric element in such a manner that this difference signal becomes zero, so that the length of the resonator is controlled to become constant.

FIG. 4 graphically represents the result obtained by monitoring the light intensity signal 500 while varying the resonator length of the above-described optical parametric oscillator at a constant rate. The oscillation of the parametric oscillator is observed within a small range of the resonator length 1.5 nm. If the magnitude of the light intensity signal 500 is controlled to become approximately 50% of the peak intensity, and the deviation is suppressed smaller than 10% of the peak intensity, then the variation in the corresponding resonator length becomes smaller than 0.07 nm. When the deviation in the magnitude of the light intensity signal 500 is suppressed below 1% of the peak intensity, the variation in the corresponding resonator becomes smaller than 0.007 nm. The setting value of the resonator length may be varied by controlling the ratio of the magnitude of the light intensity signal to the peak intensity, and it is apparent from FIG. 4 that this settable range is approximately 1.5

As previously explained, the variation in the oscillation frequencies of the pumping light laser may produce one sort of noise in view of the measurement of the resonator length. When the frequency of the pumping light is varied by 1 MHz, the variation in the resonator lengths is smaller than 0.1 nm. It is conceivable that since the variation in the oscillation frequencies of the pumping light laser employed in the present invention is at most 200 KHz, the variation in the resonator lengths caused by the change in the pumping light frequencies may be suppressed within a sufficiently narrow range less than 0.02 nm.

It should be noted that when pumping light having a shorter wavelength than that of the above-described pumping light is employed, and an optical parametric oscillator may be arranged by employing a wavelength converting element capable of phase-matching with this shorter wavelength pumping light, such a parametric oscillation output having a shorter wavelength could be obtained, and a nanodisplacement element more sensitive to the variation in the resonator lengths could be realized. In this embodiment, since the argon ion laser has been utilized as the pumping light laser and the KTP crystal has been employed as the wavelength converting element, only the light output with the wavelength range around 1.0 micrometer could be obtained. Alternatively, when the third harmonic of an Nd:YAG laser is employed as the pumping light laser, and also either a BBO, or a LBO is employed as the wavelength converting element, a parametric oscillation output with a range between 0.4 micrometers and 0.7 micrometers may be obtained. As a result, such a nanodisplacement element with higher precision may be constructed, as compared with that of the above-described nanodisplacement element.

EMBODIMENT 3

A third embodiment of the present invention will now be described with reference to FIG. 5.

In the second embodiment, the range capable of setting the resonator length was approximately 1.5 nm. To widen this setting range, the wavelength of the pumping light is varied. This third embodiment with employment of a variable wavelength pumping light laser is represented in FIG. 5. The variable wavelength pumping light laser is arranged by a semiconductor laser excited monolistic ring resonator type YAG laser, and an external resonator type second harmonic generation unit. The above-described YAG laser owns such a control characteristic that the oscillation frequency of this YAG laser can be varied in a range up to 1 GHz, while maintaining the line width of the oscillation frequency within 100 KHz by way of the precise temperature control of the crystal and the distortion control by the piezoelectric element. The external resonator type second harmonic generation unit generates light correctly having a half wavelength of that of the above-described YAG laser due to the operation principle thereof. The control characteristic of the frequency of this second harmonic is the same as that of the above-described YAG laser, and the oscillation frequency can be varied in a range up to 1 GHz while the variation of the oscillation frequency is maintained within 100 KHz. In the present invention, the second harmonic is utilized as the pumping light laser.

Since the wavelength of the second harmonic of the YAG laser is around 532 nm, the spherical mirror 212 and the flat 232 of the optical parametric oscillator utilized in this embodiment have such coating specifications operable at the wavelength approximated to the above-described wavelength. Other constructive elements of the third embodiment shown in FIG. 5 are the same as those of the first embodiment (FIG. 1).

In accordance with this third embodiment, the range capable of setting the resonator length could be extended up to approximately 100 nm in response to the variation in the pumping light wavelength within a range of 1 GHz. Based upon the oscillation frequency stabilization of the above-described pumping light laser and high sensitivity to the variation in the resonator lengths of the optical parametric resonator, resolution in displacement may be maintained less than 0.1 nm also in this case. This operation has greatly extended displaceable range, namely, up to 100 nm, while maintaining the high resolution of 0.1 nm; this feature should be essential for realizing a zooming mechanism.

Figure 5:
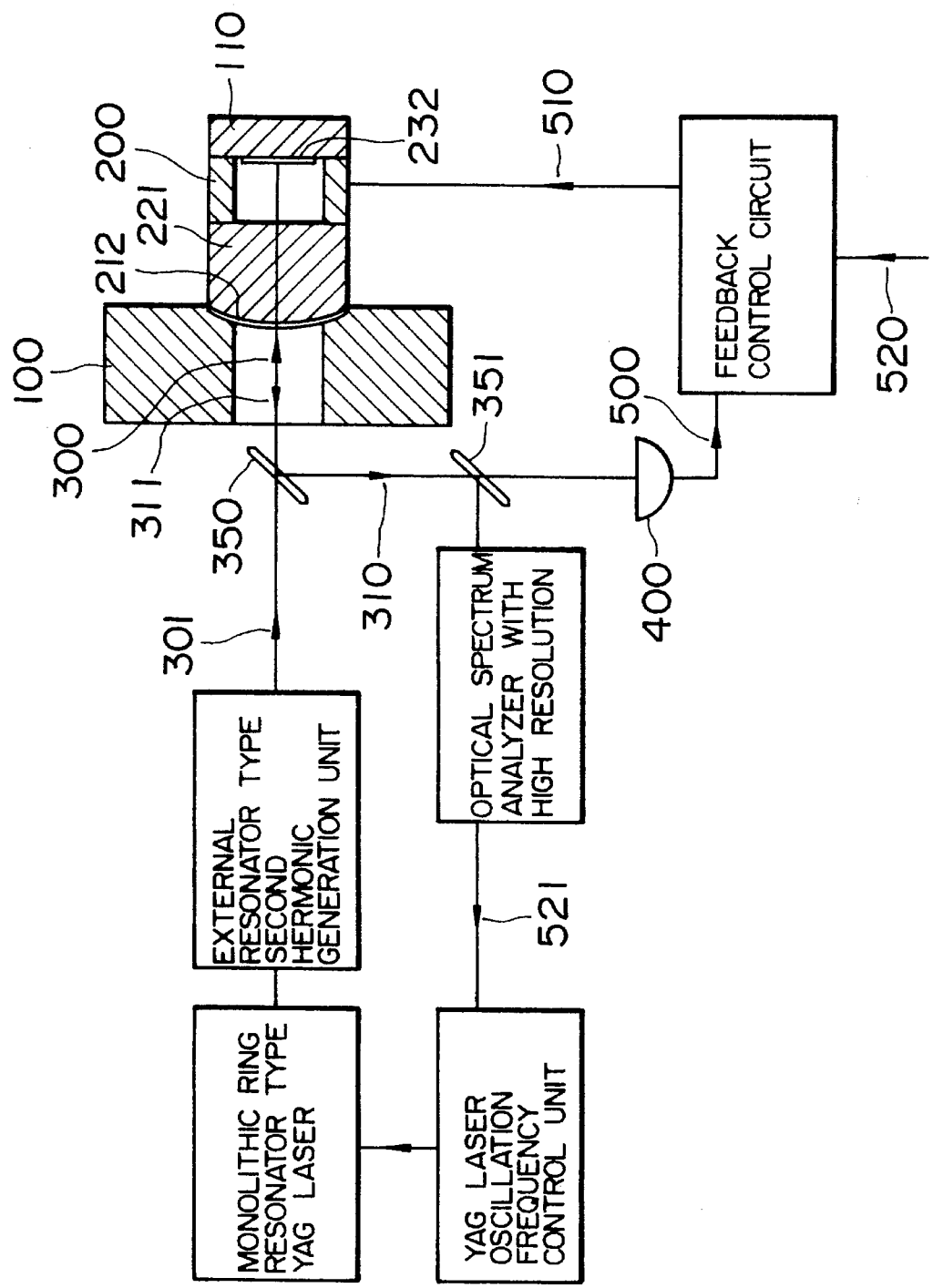
FIG. 5 schematically indicates another nanodisplacement producing apparatus constituted by employing a pump type variable optical wavelengths laser, according to a third embodiment of the present invention.

In FIG. 5, a portion of the output 310 from the optical parametric oscillator is sampled by the beam sampler 350, and then the sampled output portion is entered into an optical spectrum analyzer with high resolution. In the control system according to the present invention, such a control is carried out that even when the wavelength of the pumping light is changed, the output 310 from the optical parametric oscillator is not varied. In this case, the oscillation frequency of the output 310 from the optical parametric oscillator is changed in response to the variation in the pumping light wavelengths. In other words, the variation in the resonator lengths is reflected to the change in the frequencies of the output 310 from the above-explained parametric oscillator. A relationship between the change in the resonator lengths and the change in the oscillation frequencies may be evaluated with great accuracy based on the values of reflective indices of the KTP crystal with respect to the signal light and the idler light, and also the dimensions of the optical resonator. To this end, the variation in the frequencies of the output 310 derived from the optical parametric oscillator is read out by the optical spectrum analyzer with high resolution, and this read value may be converted into an absolute amount of the variation in the resonator lengths with great accuracy. The output 521 derived from the high-resolution optical spectrum analyzer is fed back to the YAG laser oscillation frequency control unit, so that an arbitrary lengths of the resonator can be set via the variation in the pumping light wavelengths. For instance, such an operation for displacing the resonator length by 2.00+0.01 nm and 2.00−0.01 nm from the present position, may be performed in such a manner that the present oscillation frequency of the optical parametric oscillator's output 310 is varied from 500 KHz+1 KHz to 500 KHz−1 KHz in this precision. As a result, in this apparatus, the absolute value of the length variation can be determined by reading the absolute value of the variation in the oscillation frequencies. Accordingly, the nanodisplacement producing apparatus according to the present invention may be used as a length measuring machine.

EMBODIMENT 4

With employment of FIG. 6, a fourth embodiment of the present invention will now be described.

In this embodiment, a monolithic type resonator is utilized as the optical resonator of the optical parametric oscillator. Both resonator mirrors of this optical resonator are directly coated on the KTP crystal, so that an alignment shift between the mirrors and the crystal is not produced in principle, and thus a more mechanically stable resonator can be realized. Different from the above-explained three embodiments, since there is no cylindrical piezoelectric element for changing the resonator length, the variation in the resonator lengths is caused by thermal expansion and the piezoelectric effect of the KTP crystal itself.

Figure 6:
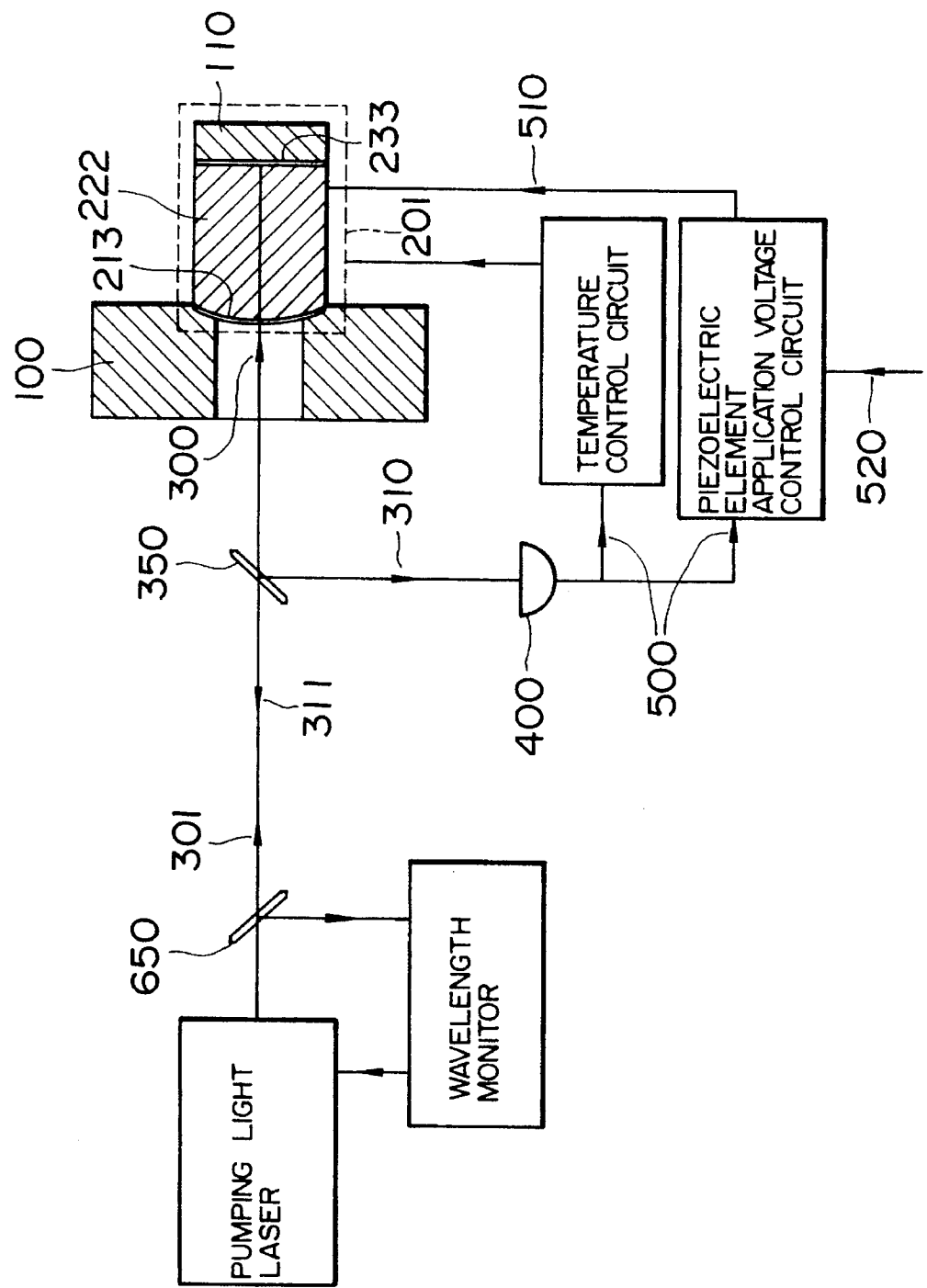
FIG. 6 schematically shows another nanodisplacement producing apparatus constituted by employing a monolithic type resonator, according to a fourth embodiment of the present invention.

In FIG. 6, reference numeral 213 indicates a mirror coated on the KTP crystal 222 provided on the pumping light incident side. This mirror 213 constitutes an optical resonator in conjunction with a mirror 233 coated on an opposite surface of this KTP crystal. The overall KTP crystal is arranged in a temperature control apparatus with precision of 1/1,000 degrees. A variation in the lengths of the KTP crystal 222, induced when the crystal temperature is changed by 1/1,000 degrees, is less than 0.1 nm. Also, another variation in the KTP crystal 222, induced by the piezoelectric effect, is 0.01 nm per 1 volt. The displacement control is carried out by detecting the variation in the outputs from the optical parametric oscillator in accordance with the same principle as that of the above-described three embodiments. Here, a light intensity signal 500 is entered into the temperature control circuit and a piezoelectric element application voltage control circuit to the KTP crystal 222 at the same time. Since the variation in the lengths of the KTP crystal 222 with respect to the applied voltage responds up to tens of KHz, the piezoelectric element application voltage control circuit plays a role to suppress a highspeed variation in the oscillation frequencies. On the other hand, although the response characteristic of the variation in the resonator variations caused by the temperature change is slower than that caused by the voltage application, it is possible to realize the variation in the resonator lengths over the wide range. By only the temperature change by approximately 30 degrees, the variation in the resonator lengths with such a wide range up to several micrometers may be obtained.

In accordance with this embodiment, since the phase matching condition can be continuously varied by way of the temperature control, the length of the resonator can be set over the wider range without varying the wavelength of the pumping light. As a consequence, the structure of the pumping light laser 300 according to this fourth embodiment is the same as that of the pumping light laser according to the first embodiment.

EMBODIMENT 5

Figure 7:
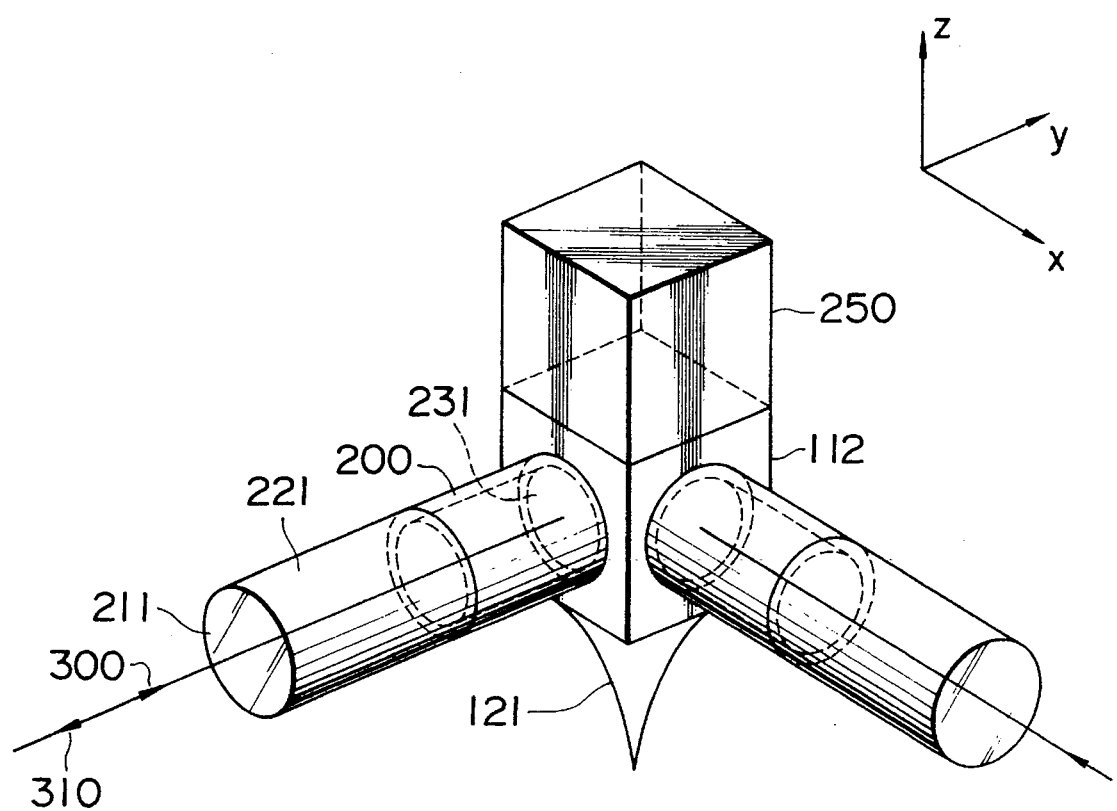
FIG. 7 schematically shows a nanodisplacement producing apparatus in which an optical controlling nanodisplacement element is applied to the trypot employed in the scanning probe microscope, according to a fifth embodiment of the present invention.

With reference to FIG. 7, a fifth embodiment of the present invention will now be described.

FIG. 7 is such an example in which the optical control nanodisplacement element according to the present invention, shown in the third embodiment (FIG. 5), is employed as a tripod actuator of a scanning probe microscope such as STM (scanning tunneling microscope). In FIG. 7, reference numeral 121 is a probe, and this probe 121 is fixed on a block 112. A piezoelectric element 250 for performing a position control along the z-axis direction is fixed on another surface of the block 112, which is located opposite to the surface on which the probe 121 is fixed. On the block 112, the optical parametric oscillator whose pumping light oscillation frequency is variable, as shown in the second embodiment, is fixed as an actuator. Pumping light 300 is incident upon this actuator so as to establish a parametric oscillation. A mirror 213 on the pumping light side is fixed to the structure for supporting the entire tripod. Two-dimensional nanodisplacement may be applied to the probe 121 in a plane (x-y plane) parallel to a sample by these actuators by the optical parametric oscillators.

In the prior art fine-displacement producing apparatus, there is such a problem that reproducibility of the probe scanning position in STM is deteriorated due to thermal drifts of the piezoelectric element itself. However, the above-described arrangement of the present invention is employed, so that expansion of the piezoelectric element could be controlled in higher precision, and thus reproducibility during the scanning operation could be considerably realized. Also, the image is acquired only during the sweeping operation along one direction in the prior art, but according to the present invention, the image can be acquired during the sweeping operation also along the reverse direction. As a result, the image acquisition time could be reduced by ½.

Further, the probe actuator according to the present invention can be adapted to the variation of the pumping light oscillation frequencies and the variation in the resonator length. For example, such an operation that the probe position is changed to a new position displaced by the distance between 2.00−0.01 nm to 2.00+0.01 nm, from the present position, may be achieved by the frequency change of the output 310 from the optical parametric oscillator by the amount between 500 KHz+1 KHz and 500 KHz−1 KHz. Since the tripod with employment of the actuator according to the present invention owns the length measuring function, the moving direction of the probe corresponds to the increase/decrease of the pump-light frequency.

Also, the actuator according to the present invention owns the ability of displacing the probe up to 100 nm while maintaining the high resolution of 0.1 nm. This indicates that the position setting precision can be made with three digits. Therefore, at the initial stage, the scanning range by the actuator is set to be wide, e.g., approximately 100 nm, and then after monitoring the image of the large region, the scanning range is gradually reduced, so that the enlarged image of the local area can be monitored. This implies a so-called zooming mechanism. Since the position setting precision of the actuator according to the present invention is high, such a zooming mechanism can be realized by employing one sort of hardware.

EMBODIMENT 6

A description will now be made of a sixth embodiment according to the present invention with using FIG. 8.

Figure 8:
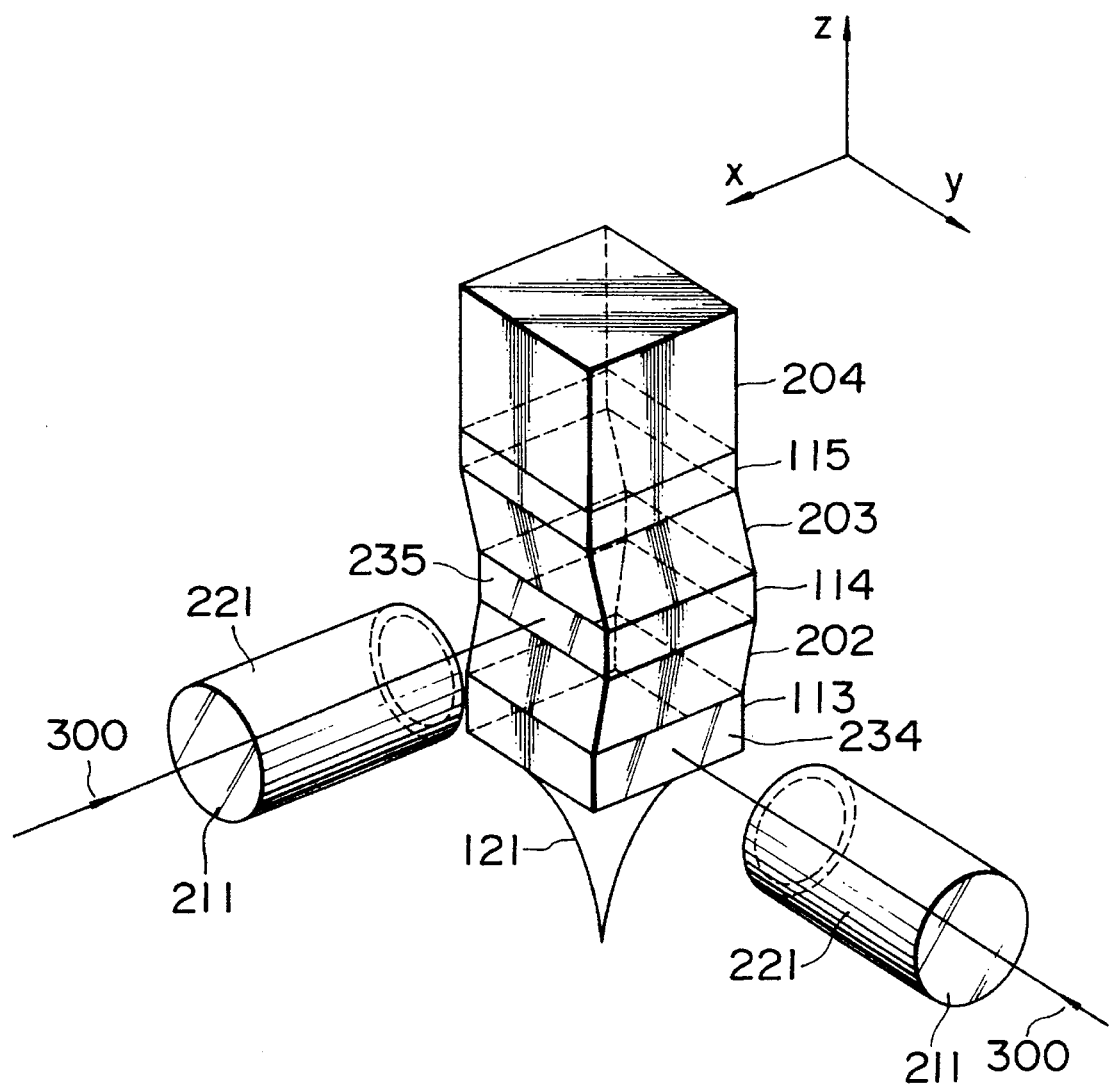
FIG. 8 schematically represents a nanodisplacement producing apparatus in which the optical controlling nanodisplacement element is combined with the shear type probe actuator employed in the scanning probe microscope, according to a sixth embodiment of the present invention.

FIG. 8 schematically shows such an embodiment that the optical control nanodisplacement element according to the present invention shown in the third embodiment (FIG. 5) is applied to a scanning probe microscopic apparatus including a shear type probe actuator. A probe 121 is fixed on a block 113, and a shear type piezoelectric element 202 is fixed on the block 113. A flat mirror 234 for constituting an optical parametric oscillator is coated on one surface of this block 113. Opposite to the flat mirror 234 of the block, KTP crystal 231 fixed on a structure member functioning as a positional base is arranged. The pumping light 300 is incident from the KTP crystal 221, and a spherical mirror 211 is coated on a surface of the KTP crystal 221 upon which the pumping light 300 is incident. In FIG. 8, the incident direction of the pumping light is arranged in parallel to the y-axis, and the resonator length of the optical parametric oscillator is controlled by displacement of the shear type piezoelectric element 202 along the y-axis direction.

A block 114 is fixed on an upper surface of the shear type piezoelectric element 202. Similar to the above-described block 113, a flat mirror 235 for constituting the optical parametric oscillator is coated on the block 114, and another KTP crystal 221 on this spherical mirror is coated is arranged in such a manner that this KTP crystal 221 is located opposite to a flat mirror 235. It should be noted that both the optical parametric oscillator on the block 114 and the pumping light 300 incident upon this parametric oscillator are arranged in parallel with the x-axis. Another piezoelectric element 204 for controlling displacement along the z-axis direction is fixed via another block 115 on the piezoelectric element 203.

In this embodiment, no cylindrical piezoelectric element is employed which performs the drive operations along the x-axis direction and the y-axis direction, and further the spherical mirror and the flat mirror 234, which constitute the optical parametric oscillator, are not mechanically in contact with each other. In view of this point, the optical parametric oscillator according to this sixth embodiment owns such a function to measure displacement of the block 113 on which the probe is fixed under non-contact condition. Also since the mechanical contact with respect to the probe is avoided as much as possible, the resonance frequency of the mechanical structure for holding the probe can be set to high resonance frequencies, so that this resonance frequency could be increased up to approximately 100 KHz substantially equal to the resonance frequency specific to the piezoelectric element. As a consequence, the scanning speed of the probe within the x-y plane can be considerably improved, so that highspeed image acquisition can be achieved.

EMBODIMENT 7

A description will now be made of a seventh embodiment of the present invention with reference to FIG. 9.

Figure 9:
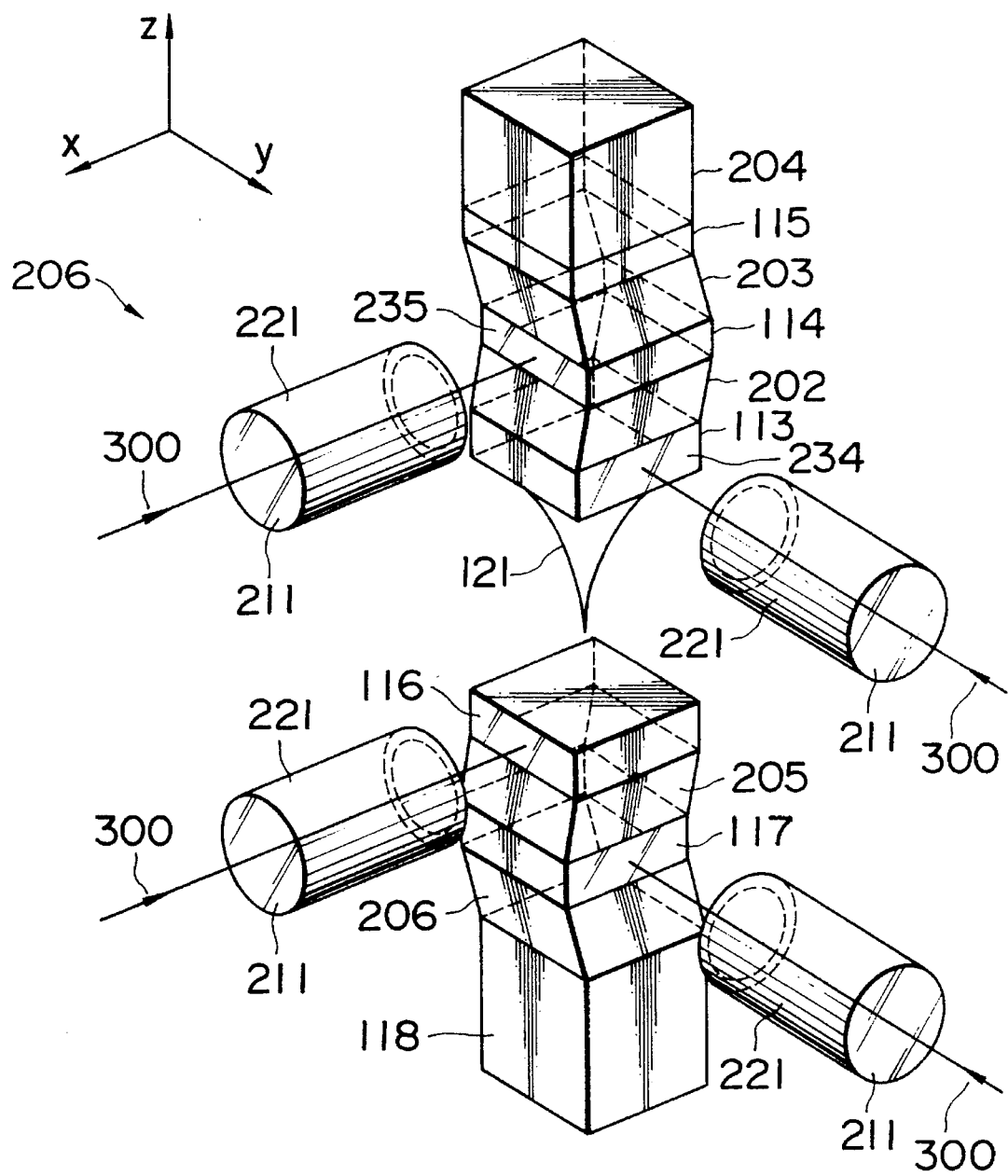
FIG. 9 schematically indicates a nanodisplacement producing apparatus in which the optical controlling nanodisplacement element is combined with a sample stage, according to a seventh embodiment of the present invention.

FIG. 9 schematically represents such an embodiment of a scanning probe microscope combined with a very small displacable sample stage 116 with employment of an actuator. Four optical parametric oscillators are employed. Both a mirror 211 and a block 118 of each of these optical parametric oscillators are fixed on a reference plane manufactured by a material whose temperature coefficient is very small. The sample stage 116, shear type piezoelectric elements 205, 206, and a block 117 are fixed on a block 118. A mutual position variation in the mirror 211 and the block 118 is negligibly small. As a consequence, the relative position of the sample stage 116 with respect to the position of the probe can be completely controlled based on the length of the actuator according to the present invention, and the relative change within the x-y plane caused by thermal drift can be completely removed. Therefore, reproducibility related to the prove scanning operation on the sample can be considerably improved, and thus the scanning probe microscope can be used under such a severe temperature variation environment.

EMBODIMENT 8

A description will now be made of an eighth embodiment of the present invention with reference to FIG. 10.

Figure 10:
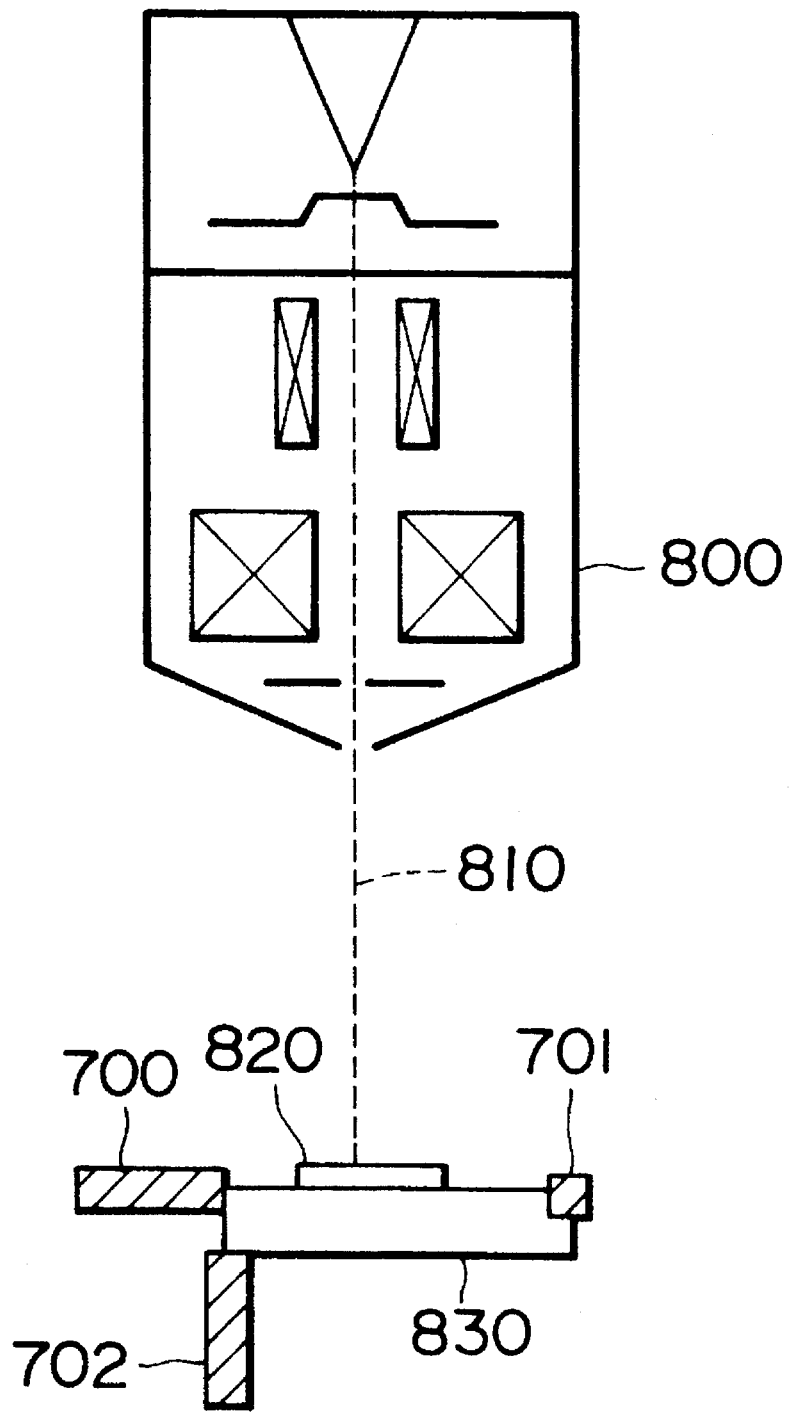
FIG. 10 schematically indicates a nanodisplacement producing apparatus in which the optical controlling nanodisplacement element is applied to the stage of the electron beam lithography apparatus, according to an eighth embodiment of the present invention.

FIG. 10 schematically represents such an embodiment that the optical control nanodisplacement mechanism as indicated in the embodiments 1 to 4 is applied to the electron beam lithography apparatus. Reference numeral 800 indicates an electron gun for the electron beam lithography apparatus, and reference numeral 810 represents an electron beam. A very fine pattern is formed on a patterning object 820 such as a wafer coated with resist by the electron beam patterning. The patterning object 820 is positioned on a stage 830. This stage 830 is driven by an x-axis direction optical control nanodisplacement mechanism 700, a y-axis direction optical control nanodisplacement mechanism 701, and a z-axis direction optical control nanodisplacement mechanism 702.

In accordance with this eighth embodiment, since the patterning object 820 can be transported in high precision, this patterning object 820 can be correctly patterned over a sufficiently wide range. with employment of the electron beam. Based on the high positioning precision and the high reproducibility by the actuator according to the present invention, a large-sized patterning could be realized.

EMBODIMENT 9

A ninth embodiment of the present invention will now be explained with reference to FIG. 11.

Figure 11:
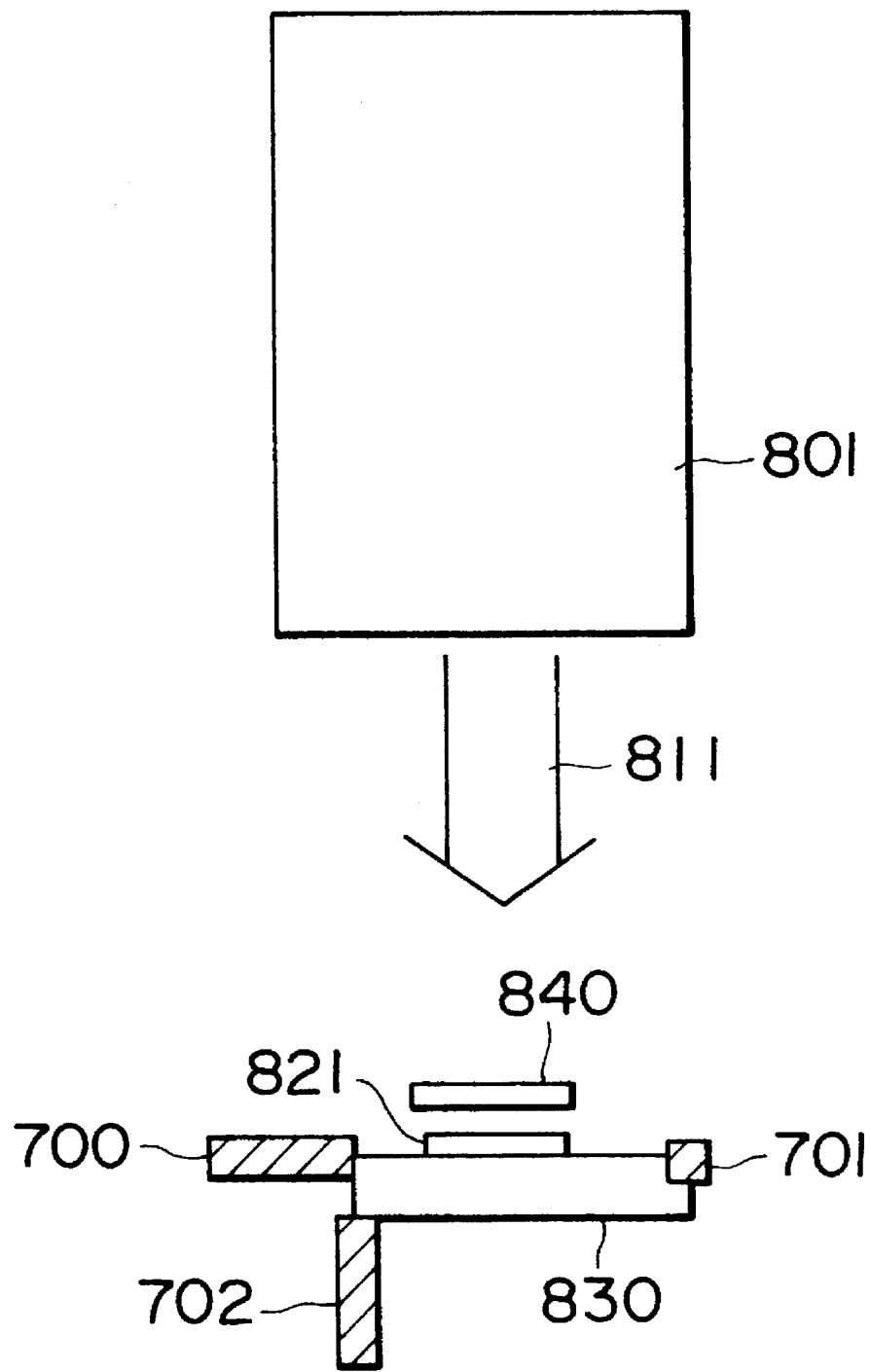
FIG. 11 schematically denotes a nanodisplacement producing apparatus in which the optical controlling nanodisplacement element is applied to the alignment mechanism of the lithography apparatus, according to ninth embodiment of the present invention.

FIG. 11 schematically shows such an example that the optical control nanodisplacement mechanism as indicated in the embodiments 1 to 4 is applied to the lithography apparatus. In FIG. 11, reference numeral 801 indicates a light source of either ultraviolet rays, or X-ray, and reference numeral 811 shows either ultraviolet light beams, or X-ray beams. A pattern formed on a mask 840 is transferred to a patterning object 821 such as a wafer coated with resist. This patterning object 821 is arranged on a stage 830, and this stage 830 is driven by an x-axis direction optical control nanodisplacement mechanism 700, a y-axis direction optical control nanodisplacement mechanism 701, and a z-axis direction optical control nanodisplacement mechanism 702.

In accordance with this embodiment, such a lithography apparatus capable of aligning the mask to the patterning object 821 at high precision can be realized.

EMBODIMENT 10

Figure 12:
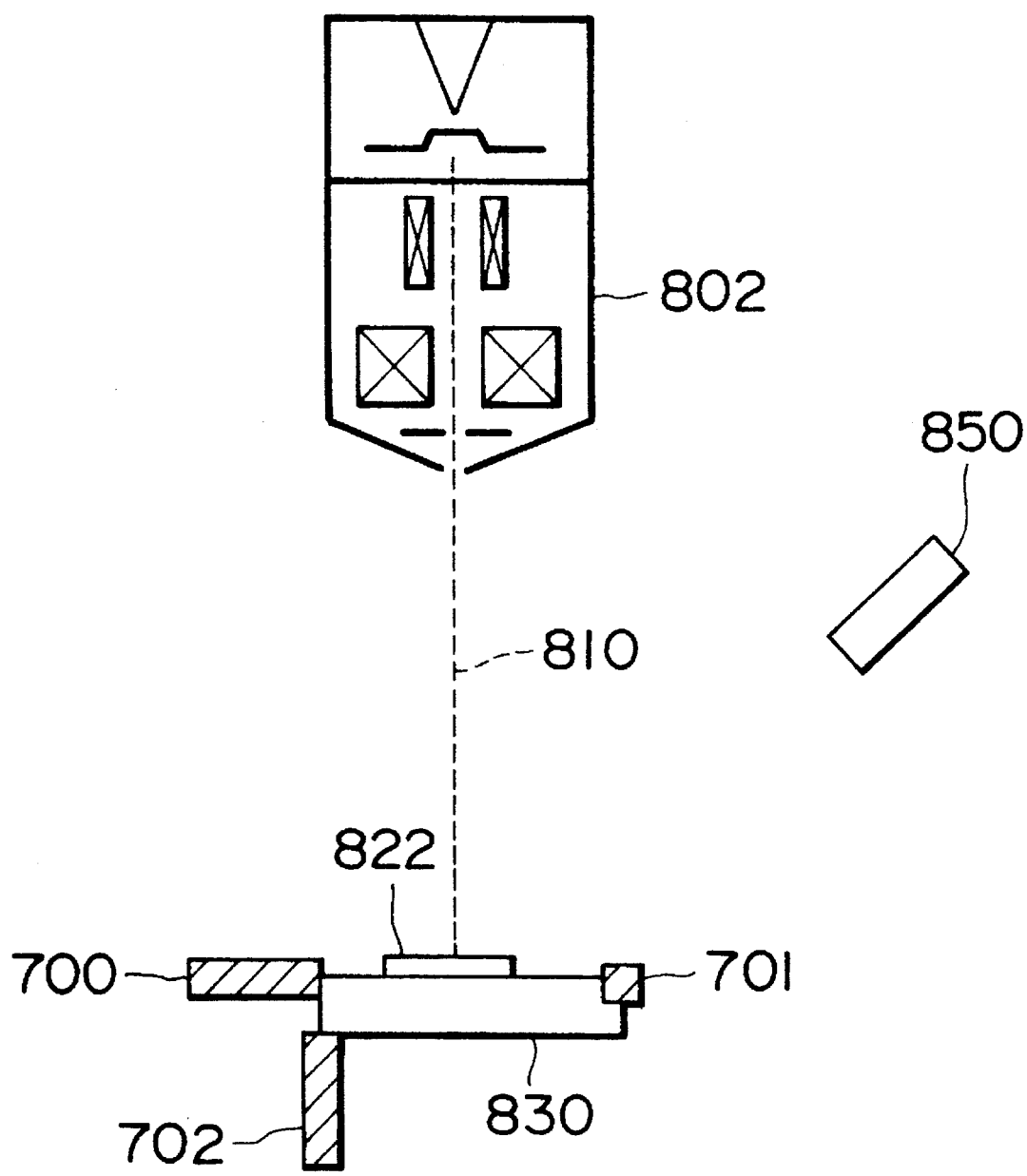
FIG. 12 schematically shows a nanodisplacement producing apparatus in which the optical controlling nanodisplacement element is applied to the sample stage of the scanning microscope, according to a tenth embodiment of the present invention.

With reference to FIG. 12, a tenth embodiment of the present invention will now be explained.

FIG. 12 schematically represents such an example that the optical control nanodisplacement mechanism as shown in the embodiments 1 to 4 is applied to the length measuring SEM (scanning electron microscope).

In FIG. 12, reference numeral 802 indicates an SEM electron gun, reference numeral 822 indicates a sample, and reference numeral 850 denotes a secondary electron detector. With the above-described arrangement, a distance between two points separated from each other by several micrometers can be measured in precision of 0.1 nanometer, which could not measured by the conventional length measuring SEM.

It should be noted that although the argon ion laser has been employed as the pumping light laser and the KTP crystal has been employed as the wavelength converting element in the respective embodiments, even when the third higher harmonic wave of the Nd:YAG laser is utilized as the pumping light and also either BBO, or LBO is employed as the wavelength converting element, a high-precision nanodisplacement element similar to that of the present embodiments may be constructed.

The present invention has been described in detail, it should be understood that various changes, substitutions and alterations can be made hereto without departing from the spirit and scope of the present invention as defined by the appended claims.

We claim:

1. A nanodisplacement producing apparatus comprising:
   an optical parametric oscillator for receiving incident light;
   a light detector for detecting an oscillation signal from said optical parametric oscillator; and
   a feedback control circuit for applying a voltage to said optical parametric oscillator in such a manner that a difference between an oscillation output signal derived from said light detector and a resonator length setting signal becomes zero;
   wherein said optical parametric oscillator is arranged by non-linear optical crystal having a spherical mirror fixed on a block; a cylindrical piezoelectric element fixed on said non-linear optical crystal; and a movable plate having a flat mirror fixed on a surface of said cylindrical piezoelectric element having another surface located opposite said surface thereof, on which said non-linear optical crystal is fixed.

2. A nanodisplacement producing apparatus as claimed in claim 1 wherein a resonator simultaneously resonated with signal light and idler light is constituted between said spherical mirror on said non-linear optical crystal and said flat mirror on said movable plate.

3. A nanodisplacement producing apparatus comprising:
   an optical parametric oscillator having an optical resonator for resonating light entering therein,
   a control means for controlling a length of said optical resonator according to an oscillation output signal derived from said optical parametric oscillator, and
   a displacement means for producing displacements for a change of the length of said optical resonator.

4. A nanodisplacement producing apparatus as claimed in claim 3 wherein said optical parametric oscillator is comprised of: a non-linear optical crystal having a spherical mirror fixed on a block; a cylindrical piezoelectric element fixed on said non-linear optical crystal; and a movable plate having a flat mirror fixed on another surface of said cylindrical piezoelectric element, wherein said another surface is located opposite said surface on which said non-linear optical crystal is fixed.

5. A nanodisplacement producing apparatus as claimed in claim 3 wherein said light resonated by said optical parametric oscillator is a laser light from either a pumping light laser, or an argon ion laser.

6. A nanodisplacement producing apparatus as claimed in claim 4 wherein said optical resonator resonates a signal light and an idler light between said spherical mirror and said flat mirror, and said signal light and said idler light are generated between said mirrors from said light entering therein.

7. A nanodisplacement producing apparatus as claimed in claim 6, further comprising:
   a feedback means for feedbacking a variation component of light intensity signals from said optical parametric oscillator to said cylindrical piezoelectric element so as to control said light intensity signals.

8. A nanodisplacement producing apparatus as claimed in claim 3 wherein:
   a portion of an oscillation output signals derived from said optical parametric oscillator is sampled by a beam splitter, and a variation in oscillating wavelengths is detected by a wave length monitor.

9. A nanodisplacement producing apparatus as claimed in claim 3 wherein:
   a portion of an oscillation output signal derived from said optical parametric oscillator is sampled by a beam sampler;
   a variation in frequencies of said oscillation output signal is read out by a spectrum analyzer to obtain a frequency variation value; and
   said nanodisplacement producing apparatus further comprises a converting means for converting said frequency variation value into an absolute value of a resonator length variation.

10. A nanodisplacement producing apparatus as claimed in claim 3, wherein said displacement means is one of a piezoelectric arrangement or a combined thermal/piezoelectric arrangement.

11. A nanodisplacement producing apparatus comprising:
    an optical resonator having a 1st mirror, a 2nd mirror, and a non-linear optical crystal, in which said 1st mirror receives incident light, and said non-linear optical crystal for converting a wavelength of said incident light is disposed between said 1st mirror and said 2nd mirror,
    a light detector for detecting an output signal derived from said optical resonator,
    a feedback control circuit for controlling a distance between said 1st mirror and said 2nd mirror in such a manner that a difference between said output signal and a resonator length setting signal becomes zero, and
    a displacement means for producing displacements according to said distance.

12. A nanodisplacement producing apparatus as claimed in claim 11, wherein said displacement means is one of a piezoelectric arrangement or a combined thermal/piezoelectric arrangement.

13. A nanodisplacement producing apparatus as claimed in claim 11 wherein said 1st mirror is a spherical mirror fixed on said non-linear optical crystal, said 2nd mirror is fixed on a plate, and said non-linear optical crystal and said plate are fixed on opposite sides of a cylindrical piezoelectric element with respect to one another.

14. A nanodisplacement producing apparatus as claimed in claim 11 wherein said 2nd mirror is coated with an anti-reflection coating with respect to said incident light.

15. A nanodisplacement producing apparatus comprising:
    a laser for emitting a pumping light,
    an optical parametric oscillator having an optical resonator for receiving and resonating said pumping light and for emitting resonated light therefrom,
    a length control means for controlling a length of said optical resonator according to an oscillation output signal derived from said optical parametric oscillator,
    a wavelength control means for controlling a wavelength of said pumping light according to said oscillation output signal, and
    a displacement means for producing displacements corresponding to a change of the length of said optical resonator.

16. A nanodisplacement producing apparatus as claimed in claim 15 wherein said optical resonator is comprised of;
    a spherical mirror fixed on a non-linear optical crystal, and a flat mirror fixed on a plate, wherein said non-linear optical crystal and said plate are fixed on opposite sides of a cylindrical piezoelectric element with respect to one another.

17. A nanodisplacement producing apparatus as claimed in claim 16 wherein said non-linear optical crystal is arranged within a temperature control apparatus.

18. A nanodisplacement producing apparatus as claimed in claim 15, wherein said displacement means is one of a piezoelectric arrangement or a combined thermal/piezoelectric arrangement.

19. A scanning probe microscope comprising:

a probe fixed on a block-like member, a piezoelectric element fixed on said block-like member, an optical parametric oscillator having an optical resonator for resonating light, one end of which corresponds with said block-like member, and a control means for controlling said piezoelectric element according to an oscillation output signal derived from said optical resonator, wherein a length of said optical resonator is changed by said piezoelectric element so that a position of said probe is controlled in accordance with an optical resonator length.

20. A scanning probe microscope comprising:

a probe fixed on a 1st block-like member having a 1st mirror, a 1st piezoelectric element fixed on said 1st block-like member on a surface opposite to said probe, a 1st optical parametric oscillator having a 1st optical resonator for resonating light, one end of which corresponds with said 1st mirror, a 2nd block-like member having a 2nd mirror, which is fixed on said 1st piezoelectric element opposite to said 1st block-like member, a 2nd piezoelectric element fixed on said 2nd block-like member opposite to said 1st piezoelectric element, a 2nd optical parametric oscillator having a 2nd optical resonator for resonating light, one end of which corresponds with said 2nd mirror, a control means for controlling said 1st and 2nd piezoelectric elements according to oscillation output signals derived from said 1st and 2nd optical resonators of said 1st and 2nd optical parametric oscillators, wherein a length of said each of said 1st and 2nd optical resonators is changed by at least one of said 1st and 2nd piezoelectric elements associated therewith so that a position of said probe is controlled in accordance with optical resonator lengths.

21. A lithography apparatus comprising:

a beam source emitting a beam, a stage on which a patterning object for patterning said beam is arranged, and a stage driving means for driving said stage, wherein said stage driving means further comprises, an optical parametric oscillator having an optical resonator, one end of which is fixed to said stage, a control means for controlling a length of said optical resonator according to an oscillation output signal derived from said optical parametric oscillator, and wherein said stage driving means drives said stage in correspondence with a change of the length of said optical resonator.

22. A scanning microscope comprising:

an electron gun emitting an electron beam, a stage on which a sample irradiated by said electron beam is arranged, a stage driving means for driving said stage, and a detector for detecting electrons from said sample, wherein said stage driving means further comprises, an optical parametric oscillator having an optical resonator, one end of which is fixed to said stage, a control means for controlling a length of said optical resonator according to an oscillation output signal derived from said optical parametric oscillator, and wherein said stage driving means drives said stage in correspondence with a change of the length of said optical resonator.

* * * * *